United States Patent [19]

McPherson

[11] 4,225,865
[45] Sep. 30, 1980

[54] GAIN-CONTROLLED AMPLIFIER CIRCUITS

[75] Inventor: Hugh McPherson, West Linton, Scotland

[73] Assignee: Ferranti Limited, Hollinwood, England

[21] Appl. No.: 20,741

[22] Filed: Mar. 15, 1979

[30] Foreign Application Priority Data

Mar. 23, 1978 [GB] United Kingdom ............... 11812/78

[51] Int. Cl.³ .......................... G01S 13/14; G01S 7/40
[52] U.S. Cl. ................................ 343/16 M; 343/17.7
[58] Field of Search ............................ 343/16 M, 17.7

[56] References Cited

U.S. PATENT DOCUMENTS 3,921,173  11/1975  Thomson ......................... 343/16 M

*Primary Examiner*—T. H. Tubbesing

*Attorney, Agent, or Firm*—Kerkam, Stowell, Kondracki & Clarke

[57] ABSTRACT

Apparatus for controlling the gains of a pair of gain-matched amplifiers includes means for applying a pilot tone of constant amplitude to each amplifier through separate attenuators during a repeated correction time interval. Three control loops are provided, one of which compares the output of one amplifier with a reference signal at times other than a correction time interval to control the gain of that amplifier. A second loop compares the output of the other amplifier with the same reference signal only during each correction time interval to control the gain of the second amplifier. Finally, the third loop compares the output of the first amplifier and the reference signal during each correction time interval to produce a signal controlling the two attenuators.

8 Claims, 3 Drawing Figures

GAIN-CONTROLLED AMPLIFIER CIRCUITS

This invention relates to gain-controlled amplifier circuits, and in particular to the gain matching of pairs of such amplifiers.

Gain-matched pairs of gain-controlled amplifiers have their main application in monopulse radar receivers though they may also be used in interferometry, direction-finding or other applications. The description which follows will therefore be concerned with the monopulse radar application.

A monopulse radar receiver contains a pair of variable-gain amplifiers, commonly referred to as the "sum" and "difference" amplifiers, which are required to have closely-matched gain over a very wide gain range, perhaps of the order of 90 dB. Gain control of the amplifiers is effected by an external automatic gain control reference signal. This is compared with the output of one of the two amplifiers and the resulting error signal is used to control the gain of the two amplifiers. The gain control loop has a long time constant so as not to respond to sudden momentary changes in amplifier signal input. In such a system it has to be assumed that the gains of the two amplifiers are equal, since they cannot be controlled independently. Since this particular application requires the two amplifier gains to be matched to within about 0.5 dB, considerable constraints are placed on the system, since in practice the gains may vary due to temperature and other effects.

It is an object of the invention to provide a gain-controlled amplifier circuit in which the gains of two such amplifiers may be closely matched at all times.

According to the present invention there is provided a gain-controlled amplifier circuit which includes a pair of gain-controlled amplifiers, signal generating means operable to generate a pilot signal of constant amplitude during a repeated correction time interval, attenuator means operable to control the level at which said pilot signal is applied equally to the inputs of said two amplifiers, a first automatic gain control loop comprising means for subtracting the output of one amplifier from a reference gain control signal at a time other than during the correction time interval to derive a first error signal for application to the gain control input of said one amplifier, a second automatic gain control loop comprising means for subtracting the output of the other amplifier from the reference gain control signal to derive a second error signal for application to the gain control input of the said other amplifier only during the correction time interval, and a correction loop comprising means for subtracting the output of said one amplifier from the reference gain control signal to derive a correction signal for application to the attenuator means during the correction time interval to control the level of the pilot tone applied to the two amplifiers.

Where the two gain-controlled amplifiers are the sum and difference amplifiers of a monopulse radar receiver, the correction time interval is the time interval between the receipt of the last echos resulting from a transmitted pulse and the following transmitted pulse.

An embodiment of the invention will now be described with reference to the accompanying drawings, in which.

Figure 1:
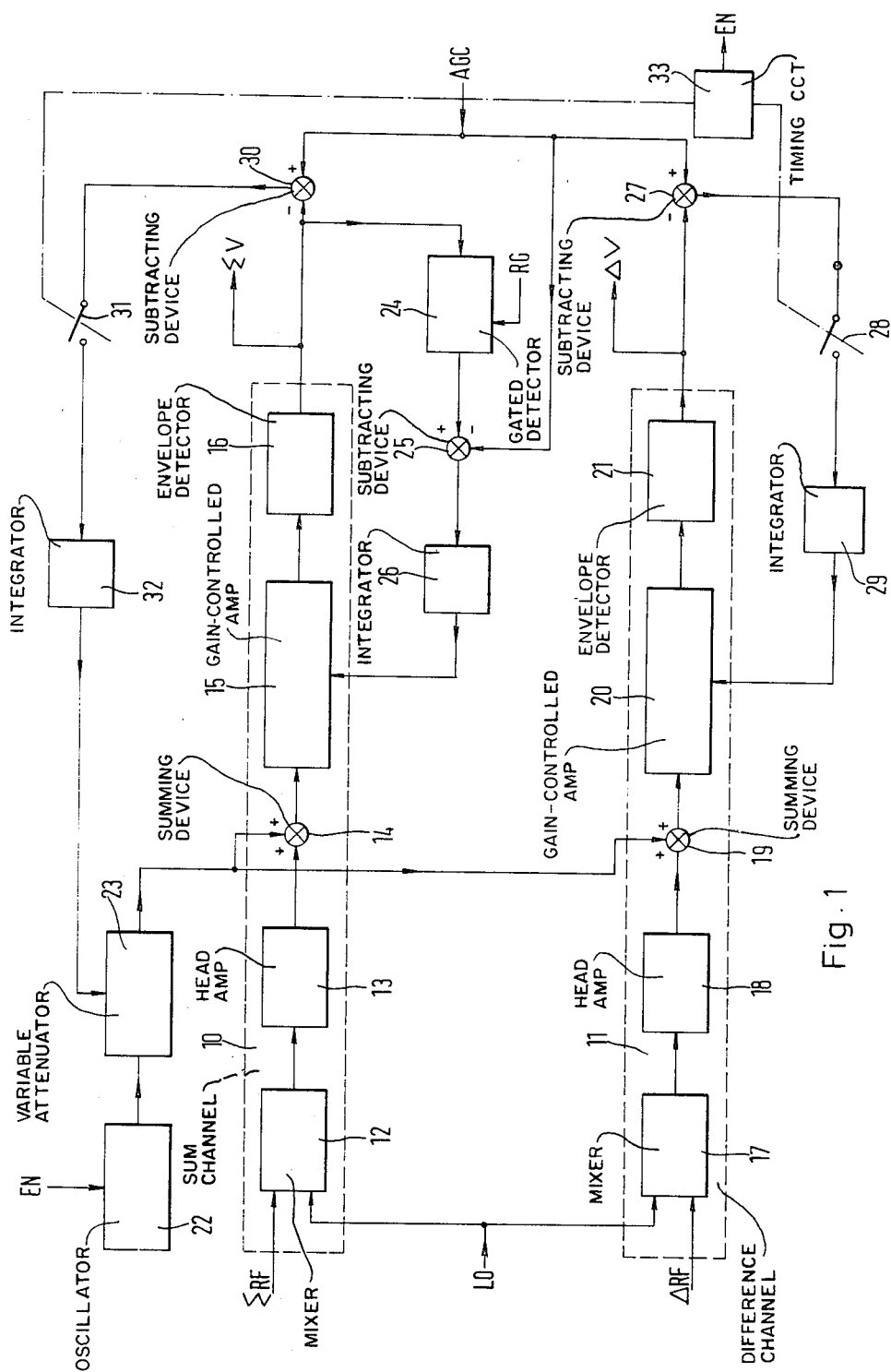
FIG. 1 is a schematic block diagram of an amplifier circuit.

Referring now to FIG. 1, this shows the sum and difference channels of a monopulse radar receiver together with the gain control circuitry. The main features are the "sum" channel 10 and the "difference" channel 11. The sum channel 10 comprises a mixer 12 to which are applied the "sum" RF signal $\Sigma rf$ and the output of LO of a local oscillator (not shown). The output of the mixer is connected via a head amplifier 13 to one input of a summing device 14, the output of which is applied to the input of the "sum" gain-controlled amplifier 15. The output of the gain-controlled amplifier 15 passes to an envelope detector 16 which provides the sum video output $\Sigma v$.

The difference channel 11 is very similar, having a mixer 17 to which are applied the "difference" RF signal $\Delta RF$ and the local oscillator output LO. The output of the mixer 17 passes through a head amplifier 18 to one input of a summing device 19, and hence to the input of the "difference" gain-controlled amplifier 20. The output of the amplifier 20 is applied to an envelope detector 21 which provides the difference video output $\Delta V$. So far, apart from the summing devices 14 and 19, the circuit has been conventional.

An oscillator 22 has an enabling or controlling input EN and provides, when enabled, a burst of a sinusoidal RF signal which is passed to a variable attenuator 23. The output from the attenuator 23 is divided equally between the other inputs of the two summing devices 14 and 19.

The video output of the envelope detector 16, representing the amplitude of the output of the amplifier 15, is applied to a first gain control loop which includes a gated detector 24, commonly used in monopulse radar receivers, to which is applied a range gating input RG. The output of the detector forms one input of a subtracting device 25 to which is also applied a reference gain control signal AGC. The difference output, representing the error between the required and actual gains of the amplifier 15, is applied by way of an integrator 26 to the gain-control input of the amplifier 15.

A second gain control loop is provided for amplifier 20. The output of the envelope detector 21 and the reference gain control signal AGC form the two inputs of a subtracting device 27. The error signal output of this is applied by way of a switch 28 and an integrator 29 to the gain control input of the difference amplifier 20.

The remaining part of the circuit is the correction loop which controls the attenuator 23. The output of the envelope detector 16 and the reference gain control signal form the inputs of a subtracting device 30. The output of this is applied by way of a switch 31 and an integrator 32 to the control input of the attenuator 23.

The two switches 28 and 31 and the enabling input EN of the oscillator 22, are controlled by a timing circuit 33. The range gate input RG is a pulse applied at a known time after a radar transmitter pulse, thus defining a narrow range "window" which is variable.

Figure 2:
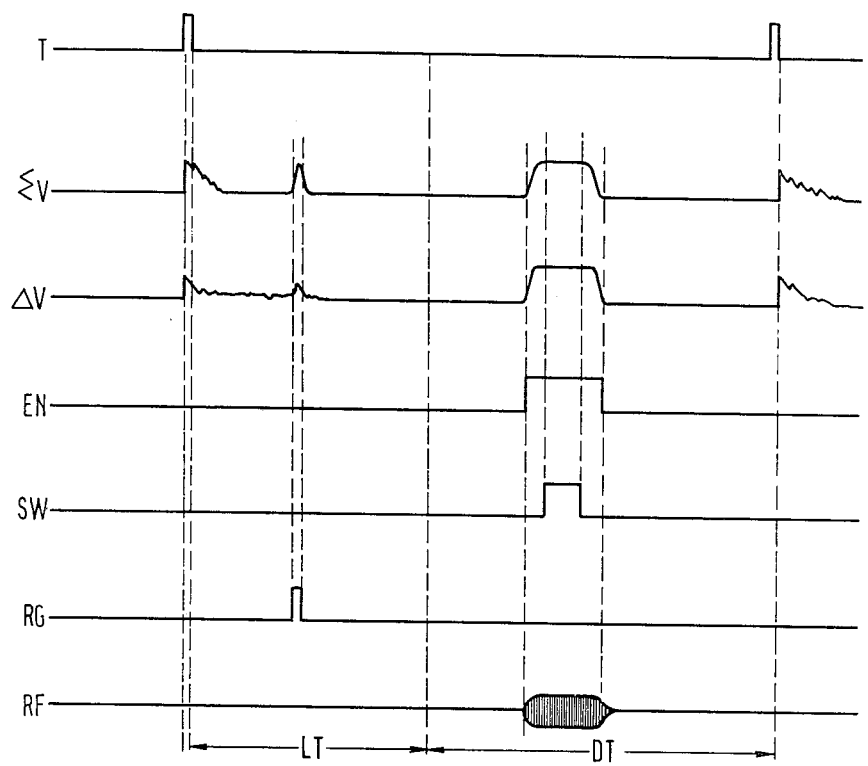
FIG. 2 illustrates waveforms obtained at various points in the circuit of FIG. 1.

Considering first the situation when the radar is tracking a target within the range gate, each range gate pulse RG following a known time after a transmitter pulse T, during the radar listening time LT, causes the amplitude of the output of sum amplifier 15 to be sampled by the gated detector 24. The sampled value is held in the detector until the appearance of the next range gate pulse RG. The sampled value is compared with the reference voltage AGC, and the error, if any, is integrated by integrator 26. The output of the integrator controls the gain of the sum amplifier 15 so as to reduce this error to zero over a large number of cycles. In this way the mean level of a succession of target amplitude samples is controlled to agree with the reference voltage. FIG. 2 shows the various timings and some of the waveforms involved. The sum and difference video signals and the range gate pulse RG are shown.

During the radar dead time DT, as illustrated in FIG. 2, the timing circuit applies the enable signal EN to the oscillator 22. FIG. 2 shows the resulting burst of RF signal produced by the oscillator, and the resulting amplifier output envelopes which appear on the video outputs of the sum and difference channels. The video pulse appearing at the output of the sum channel is compared with the reference gain control signal AGC by the summing device 30, and the video pulse appearing at the output of the difference channel is similarly compared by summing device 27. Switches 28 and 31 are closed by a signal SW at some time whilst the oscillator 22 is operating, to avoid any transient effects due to the rise and fall times of the oscillator output.

The output of difference device 30, when switch 31 is closed, is integrated by integrator 32, the integrator output controlling the attenuation of attenuator 23. Over several cycles the attenuation is varied so that the amplitude of the injected signal from the attenuator 23 is the same as the mean amplitude of the target signal at the input to the amplifier occurring during the range "window" defined by the range gate pulse RG.

The error signal produced by the difference device 27 is integrated by 29 when switch 28 is closed, and the output of the integrator controls the gain of the difference amplifier so that its output is equal to that of the sum amplifier.

The two amplifiers have the same injected signal from the oscillator 22 and their output levels are both equal to the reference gain control signal. Hence the gains of the two amplifiers are the same.

Figure 3:
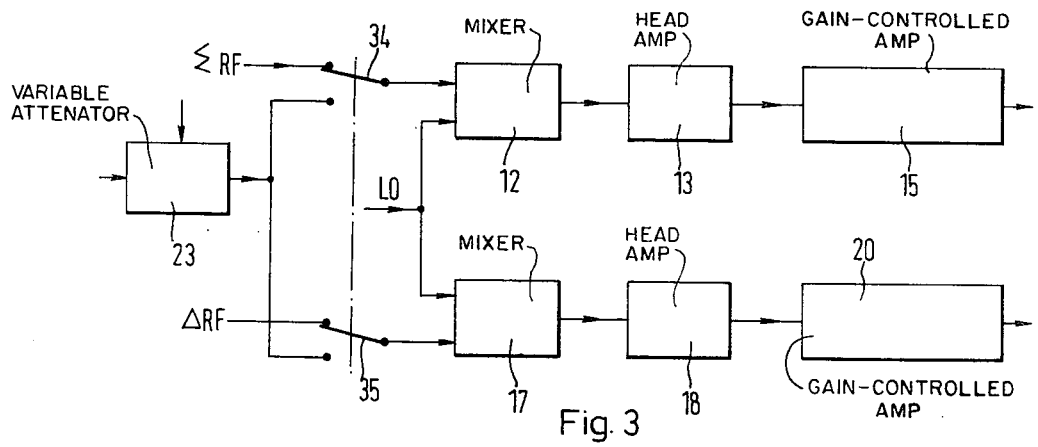
FIG. 3 shows a modified arrangement of part of the circuit diagram of FIG. 1.

Since the RF signal from the oscillator 22 is fed into each channel immediately before the amplifiers themselves, the gain control system cannot correct for any gains or losses earlier in each channel, for example in the mixers or head amplifiers. This disadvantage may be avoided by feeding the RF signal from the oscillator 22 via attenuator 23 into each channel at the inputs to the mixers. Any correction now applied compensates for gain errors arising anywhere in the channel. Such an arrangement is shown in FIG. 3, which is a schematic diagram of only the front end of each channel and the RF signal injection. The remainder of the diagram is the same as for FIG. 2, with the omission of summing devices 14 and 19 from the positions shown in FIG. 1. FIG. 3 also illustrates a further modification, namely the replacement of summing devices 14 and 19 by switches 34 and 35. Those switches allow the inputs to the two mixers 12 and 17 to be selected from either the target signal or the RF signal. This avoids problems due to the arrival of spurious signals from the antenna during the radar dead-time.

As already stated, the technique described above may be applied in other areas than monopulse radar. It may be used in any application where the gains of two channels must be equalised, providing that some time is available at intervals when the channels are not required to process incoming signals.

What I claim is:

1. A gain-controlled amplifier circuit which includes a pair of gain-controlled amplifiers, signal generating means operable to generate a pilot signal of constant amplitude during a repeated correction time interval, attenuator means operable to control the level at which said pilot signal is applied equally to the inputs of said two amplifiers, a first automatic gain control loop comprising means for subtracting the output of one amplifier from a reference gain control signal at a time other than during the correction time interval to derive a first error signal for application to the gain control input of said one amplifier, a second automatic gain control loop comprising means for subtracting the output of the other amplifier from the reference gain control signal to derive a second error signal for application to the gain control input of the said other amplifier only during the correction time interval, and a correction loop comprising means for subtracting the output of said one amplifier from the reference gain control signal to derive a correction signal for application to the attenuator means during the correction time interval to control the level of the pilot signal applied to the two amplifiers.

2. A circuit as claimed in claim 1 which includes switching means operable to activate the signal generating means only during the correction time interval.

3. A circuit as claimed in claim 2 including means for operating the switching means for derivation of said second error signal and said correction signal only during the period of operation of the signal generating means.

4. A circuit as claimed in claim 1, said signal generating means comprising means for generating the pilot signal at a frequency within the pass-band of the two gain-controlled amplifiers.

5. A circuit as claimed in claim 4, said signal generating means comprising means for generating the pilot signal at the normal center frequency of the two amplifiers.

6. A circuit as claimed in claim 4 said signal generating means comprising means for generating a sinusoidal form.

7. A circuit as claimed in claim 1 in which the two gain-controlled amplifiers are the sum and difference amplifiers of a monopulse radar receiver, the correction time interval occurring during the radar dead time.

8. A circuit as claimed in claim 7 in which each of the two gain-controlled amplifiers is preceded by mixing means, the output of the signal generating means being applied to the inputs of the mixing means.

* * * * *